United States Patent
Burns et al.

(10) Patent No.: US 6,633,825 B2
(45) Date of Patent: Oct. 14, 2003

(54) AUTOMATIC CALIBRATION OF TIME KEEPING FOR UTILITY METERS

(75) Inventors: Gordon R. Burns, West Lafayette, IN (US); John P. Junker, Lafayette, IN (US)

(73) Assignee: Siemens Power Transmission & Distribution, Inc., Wendell, NC (US)

(*) Notice: Subject to any disclaimer, the term of this patent is extended or adjusted under 35 U.S.C. 154(b) by 178 days.

(21) Appl. No.: 09/897,586

(22) Filed: Jun. 29, 2001

(65) Prior Publication Data

US 2003/0004661 A1 Jan. 2, 2003

(51) Int. Cl.[7] .............................................. G01R 35/04
(52) U.S. Cl. .......................... 702/61; 702/60; 702/85; 702/89; 324/74
(58) Field of Search ........................... 702/60–62, 57, 702/64, 65, 79, 85, 104, 106, 107, 122–126, 176–178, 183, 187–189, 198, FOR 103, FOR 104, FOR 106, FOR 111, FOR 112, FOR 134, FOR 156–FOR 163, FOR 170, FOR 171, 89; 340/870.01, 870.02, 870.04, 870.05, 637, 657, 660; 705/63, 412; 324/74, 103 R, 116, 130, 137, 140 R, 141, 142; 307/125, 126; 700/286, 291, 293, 295–297

(56) References Cited

U.S. PATENT DOCUMENTS

| | | | |
|---|---|---|---|
| 4,216,527 A | 8/1980 | Emerson et al. | 702/62 |
| 4,218,737 A | 8/1980 | Buscher et al. | 702/62 |
| 4,291,375 A | 9/1981 | Wolf | 702/62 |
| 4,337,463 A | 6/1982 | Vangen | 340/825.2 |
| 4,348,730 A | 9/1982 | Emerson et al. | 702/62 |
| 4,622,640 A | 11/1986 | Shimamura et al. | 702/61 |
| 4,945,486 A | 7/1990 | Nitschke et al. | 701/114 |
| 5,027,297 A | 6/1991 | Garitty et al. | 702/187 |
| 5,301,122 A | 4/1994 | Halpern | 702/62 |
| 5,325,048 A * | 6/1994 | Longini | 324/74 |
| 5,627,759 A | 5/1997 | Bearden et al. | 702/62 |
| 5,680,324 A | 10/1997 | Schweitzer, III et al. | 370/241 |
| RE35,793 E | 5/1998 | Halpern | 702/62 |
| 6,429,785 B1 * | 8/2002 | Griffin et al. | 340/870.02 |
| 6,501,257 B1 * | 12/2002 | Elmore | 324/74 |

* cited by examiner

Primary Examiner—Hal Wachsman
(74) Attorney, Agent, or Firm—Maginot, Moore & Bowman

(57) ABSTRACT

An arrangement for adaptive time keeping in a utility meter includes a timing circuit and a controller. The timing circuit is operable to generate timing signals. The controller is operably coupled to the timing circuit to receive timing signals therefrom. Further, the controller is operable to: generate a first real-time value based at least in part on an externally generated first reference time value; derive a subsequent second real-time value, based at least in part on the first real-time value, the timing signals, and a timing circuit calibration value; obtain an externally generated second reference time value; determine a rate adjustment based at least in part on a difference between the second real-time value and the second reference time value; and generate a subsequent real-time value based at least in part on the timing signals, the timing circuit calibration value, and the rate adjustment.

33 Claims, 6 Drawing Sheets

AUTOMATIC CALIBRATION OF TIME KEEPING FOR UTILITY METERS

FIELD OF THE INVENTION

The present invention relates generally to improved time keeping for utility meters, and more particularly, to adaptively calibrating a real-time clock in a utility meter responsive to inaccuracy in the real-time clock during operation of the meter.

BACKGROUND OF THE INVENTION

Utility meters are devices that, among other things, measure the consumption of a utility provided commodity, such as electric energy, gas, or water, by a residence, factory, commercial establishment or other such facility. Utility service providers employ utility meters to track individual customers' usage of utility provided commodities. Utilities track customer usage for many purposes, including billing and tracking demand for the relevant consumed commodity.

Increasingly, utility service providers prefer utility meters that employ electronic circuitry to perform measurement and communications operations. Electronic circuitry reduces the number of moving parts required to perform measurement operations, resulting in increased accuracy as well as higher reliability. Further, a utility meter is typically installed at or near the facility or residence of each customer. As a result, service providers historically needed field technicians or "meter-readers" to obtain data from the remotely located utility meters. Such manual meter reading imposes significant labor costs and is vulnerable to transportation problems and human error. Electronic circuitry also addresses this problem by allowing utility meters to communicate metering data and other information (such as, for example, various diagnostic data) to remote, central facilities, whereby large numbers of utility meters may be read remotely without human meter-readers.

Utility meters having electronic circuitry increasingly require accurate real-time clocks in order to function properly. For example, some meters store time correlated data for the purposes of charging customers different rates depending on the times of day when particular amounts of electricity are consumed. Such metering operations are typically referred to as "time of use" metering. Time of use metering requires a highly accurate clock to ensure accurate billing.

Another type of metering that is sensitive to clock inaccuracy is demand metering. In demand metering, a customer may be charged based on the customer's highest usage rate over any demand period within a billing cycle. A demand period is a finite time period, such as 15 minutes or an hour. An inaccurate clock can substantially degrade demand meter data, thereby resulting in significant overcharging or undercharging.

Generally, utilities have relied on two techniques to maintain time keeping accuracy in their meters: factory calibration and field synchronization. Essentially, factory calibration adjusts the rate at which time keeping devices accrue time. Traditional calibration techniques require special factory test equipment and access to components of the time keeping devices. While factory calibration settings can compensate for initial inaccuracies of the time keeping devices, factory calibration cannot accurately take into account factors that affect the accuracy of the time keeping devices over time.

By contrast, field synchronization involves periodically resetting the meter's accrued real-time value to match a standard real-time value. In some utility meters, field synchronization involves communication circuitry that communicates with remote facilities to automatically obtain the synchronization data from remote standard clocks. Nevertheless, the effectiveness of synchronization is limited because a poorly calibrated time keeping devices will still gain or lose significant amounts of time between synchronizations.

As a result, conventional methods of factory calibration and field synchronization of time keeping devices in utility meters still require undesirably frequent removal of the utility meters from the field for recalibrations and/or undesirably frequent field synchronization communications.

Accordingly, there is a need for an improved technique for maintaining time keeping accuracy in utility meters which reduces requirements to remove the utility meters from the field for recalibrations and reduces the required frequency of field synchronization communications. There is a further need for a utility meter which employs such a technique.

SUMMARY OF THE INVENTION

The present invention fulfills the above need, as well as others, by utilizing an adaptive calibration that automatically adjusts the calibration of the real-time clock of a utility meter. In other words, the adaptive calibration of the present invention automatically adjusts the rate at which the real-time clock operates. To this end, accrued clock error is measured with reference to a time standard. The meter automatically adjusts its time keeping calibration based on the measured clock error. As a result, long term error inducing effects, such as those due to variable environmental conditions and component aging, may be compensated to reduce the clock error.

In accordance with one embodiment of the present invention, a utility meter includes a source of commodity consumption information, a timing circuit, a communication circuit, and a controller. The timing circuit is operable to generate timing signals, and the communication circuit is operable to receive externally generated reference time values. The controller is operably coupled to: the source of commodity consumption information to receive commodity consumption information therefrom; the timing circuit to receive timing signals therefrom; and the communication circuit to obtain the externally generated reference time values therefrom. Further, the controller is operable to: generate metering information based at least in part on the commodity consumption information; generate a first real-time value based at least in part on an externally generated first reference time value; derive a subsequent second real-time value, based at least in part on the first real-time value, the timing signals, and a timing circuit calibration value; obtain an externally generated second reference time value; determine a rate adjustment based at least in part on a difference between the second real-time value and the second reference time value; and generate a subsequent real-time value based at least in part on the timing signals, the timing circuit calibration value, and the rate adjustment.

In accordance with another embodiment of the present invention, an arrangement for adaptive time keeping in a utility meter is provided. The arrangement comprises a timing circuit and a controller. The timing circuit is operable to generate timing signals. The controller is operably coupled to the timing circuit to receive timing signals therefrom. Further, the controller is operable to: generate a first real-time value based at least in part on an externally generated first reference time value; derive a subsequent second real-time value, based at least in part on the first real-time value, the timing signals, and a timing circuit calibration value; obtain an externally generated second reference time value; determine a rate adjustment based at least in part on a difference between the second real-time value and the second reference time value; and generate a subsequent real-time value based at least in part on the timing signals, the timing circuit calibration value, and the rate adjustment.

In accordance with another embodiment of the present invention, a method of adaptively calibrating a real-time clock within a utility meter is provided. The method comprises: generating a first real-time value based at least in part on an externally generated first reference time value; deriving a subsequent second real-time value based at least in part on the first real-time value, the timing signals, and a timing circuit calibration value; obtaining an externally generated second reference time value; determining a rate adjustment based at least in part on a difference between the second real-time value and the second reference time value; and generating a subsequent real-time value based at least in part on the timing signals, the timing circuit calibration value, and the rate adjustment.

Thus, by generating timing circuit rate adjustments base on differences between externally generated elapsed time values and elapsed time values calculated within the meter, the utility meter according to the present invention automatically and adaptively calibrates its real-time time keeping circuitry responsive to observed errors in the real-time kept in the meter during operation. This reduces requirements to remove the meter from the field for recalibrations and can reduce the required frequency of field synchronization communications.

The above discussed features and advantages, as well as others, may be readily ascertained by those of ordinary skill in the art by reference to the following detailed description and accompanying drawings.

DETAILED DESCRIPTION

Figure 1:
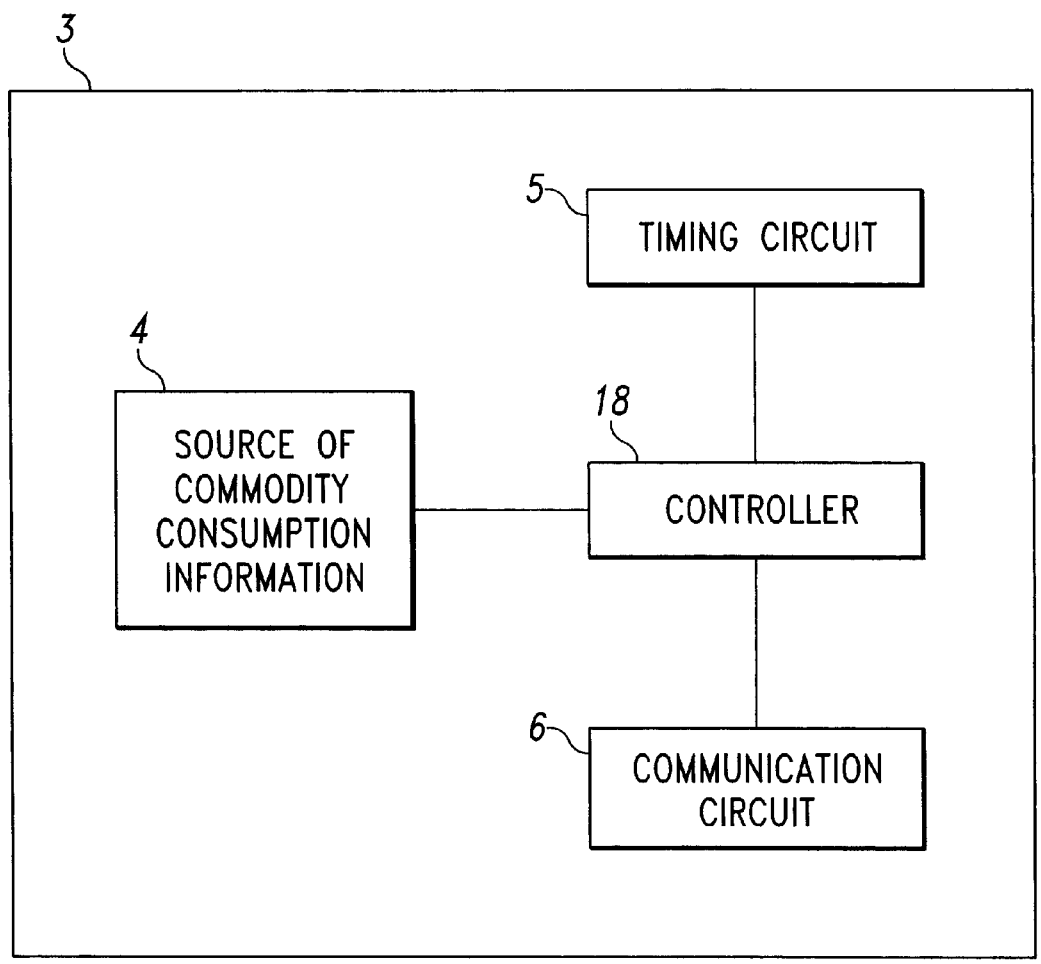
FIG. 1 shows a block diagram of an exemplary utility meter including an exemplary arrangement for adaptive time keeping according to the present invention.

FIG. 1 shows a block diagram of an exemplary utility meter 3 according to the present invention. In general, the utility meter 3 generates metering information regarding the usage of a commodity, such as, for example, gas, water, or electricity. The metering information may include real-time correlated quantities such as, for example, those associated with time-of-use metering.

Time-of-use metering involves the accumulation of commodity usage information that is correlated to the time of day. In this manner, the utility may use varying rates, based on the time of day, to deter usage of a commodity during traditionally high demand time periods. For example, because afternoons in the summer are traditionally high electricity demand periods, the service provider may charge a premium rate for energy consumed between 2:00 p.m. and 6:00 p.m. every day.

In any event, to accommodate the generation of real-time correlated metering information, the exemplary utility meter 3 includes an arrangement for adaptive time keeping which is formed by a timing circuit 5 and a controller 18. In general, the arrangement for adaptive time keeping generates quantities, such as, for example, numbers or signals, each of which represent a particular time, such as, for example, the time of day. The utility meter 3 further comprises a source of commodity consumption information 4 and a communication circuit 6.

The source of commodity consumption information 4 is a device that is operable to provide commodity consumption information or data regarding a customer's present usage of at least one utility provided commodity. For example, the source of commodity consumption information 4 may generate electrical energy consumption information such as present watts, VAs, VARs, watt-hrs, VA-hrs, and/or VAR-hr; and/or water consumption information such as present gallons of water consumed, and/or present gallons per minute consumed, and/or other information related to the present consumption of other commodities such as gas, oil, etc. To this end, the phrases "commodity consumption information" and "commodity consumption data" are used interchangeably herein, and the source of commodity consumption information 4 is constructed in any of various suitable manners which are well known. An exemplary embodiment of the source of commodity consumption information 4 in which the commodity electrical energy is the combination of the electrical sensor circuit 12 and the electrical energy consumption circuit 16 of the exemplary electronic electrical utility meter 10, discussed in further detail in connection with FIG. 3.

The timing circuit 5 is a circuit that is operable to generate suitable timing signals representative of real-time intervals. The timing signals may be, for example, pulses having a period approximately representative of a specific time interval. As will be discussed below, the timing signals are used for, among other things, adaptive time keeping within the utility meter 3. The timing circuit 5 is constructed in any of various suitable manners which are well known. Preferably, the timing circuit 5 includes a crystal oscillator circuit, such as the crystal oscillator circuit 44 discussed below in connection with FIG. 3.

The communication circuit 6 is generally operable to receive externally generated reference time values from an external device (not shown). Additionally, the communication circuit 6 suitably may be operable to effectuate other communications with one or more external devices such as, for example, to transmit metering information generated by the utility meter 3 to an external device. To this end, the communication circuit 6 is constructed in a manner which is well known and may comprise, for example, a hardwire communication circuit including a universal asynchronous receiver/transmitter ("UART"), a dual-tone multi-frequency ("DTMF") device, or any other suitable hardwire communication device; a wireless communication circuit including an amplitude modulated ("AM") receiver/transmitter, a frequency modulated ("FM") receiver/transmitter, or any other suitable wireless communication device; an optical communication circuit including a fiber optic receiver/transmitter, an infrared receiver/transmitter, or any other suitable optical communication device; or any other suitable communication circuit. Various ways of making and using suitable communication circuits are well known. Nevertheless, an exemplary embodiment of the communication circuit 6 is the PSTN communication circuit 45 of the exemplary electronic electrical utility meter 10, discussed in further detail in connection with FIG. 3.

The controller 18 is operably coupled to the source of commodity consumption information 4 to receive the commodity consumption information therefrom. The controller 18 is furthermore operably coupled to the timing circuit 5 to receive the timing signals therefrom. In addition, the controller 18 is operably coupled to the communication circuit 6 to obtain the externally generated reference time values therefrom.

In preferred embodiments, the controller 18 is also operable to generate the metering information based at least in part on the commodity consumption information. Preferably, the controller 18 is further operable to time correlate the commodity consumption information and generate the metering information based at least in part on the time correlated commodity consumption information. Time correlated information is information that requires real-time information, and may include, as discussed above, time-of-use metering information.

To facilitate the time correlation of the commodity consumption information, among other things, the controller 18 is further operable to maintain one or more real-time clocks, preferably as a software program executed by the controller 18. The "real-time clock" of the controller 18 is operable to generate "real-time values" based on timing signals received from the timing circuit 5. A "real-time value" as used herein means a quantity or quantities, such as, for example, number(s) or signal(s), which represent an approximate amount of elapsed time and may be directly or indirectly correlated to the time of day. Preferably, a real-time value monotonically increases with time. It will be appreciated that the real-time clock may constitute a separate processor and/or circuit instead of a software clock executed by the controller 18.

To maintain the real-time clock in accordance with the present invention, the controller 18 performs adaptive time keeping operations as discussed generally below in connection with FIG. 2. As will be discussed below, the adaptive time keeping operations performed by the controller 18 adaptively compensate the real-time clock with the controller 18 for degradation in operation of the timing circuit over time.

The controller 18 is constructed in any of various suitable manners which are well known, and may comprise, for example, a microprocessor, a microcontroller, a state machine, discrete digital circuitry, other types of processors or a combination of any of the above. An exemplary embodiment of the controller 18 shown in FIG. 1 is the controller 22 of the exemplary electronic electrical utility meter 10 which is discussed in further detail in connection with FIG. 3.

In operation, the exemplary utility meter 3 of FIG. 1 works generally in the following manner. The source of commodity consumption information 4 generates commodity consumption information and the timing circuit 5 generates timing signals. The controller 18 receives the commodity consumption information from the source of commodity consumption information 4, and generates metering information based at least in part on the commodity consumption information. The controller 18 furthermore receives timing signals from the timing circuit 5 and generates real time values based thereon.

Preferably, the metering information generated by the controller 18 is also based at least in part on at least one real-time value. In accordance with the present invention, the controller 18 also adaptively calibrates the real-time clock generally as discussed next in connection with FIG. 2.

Figure 2:
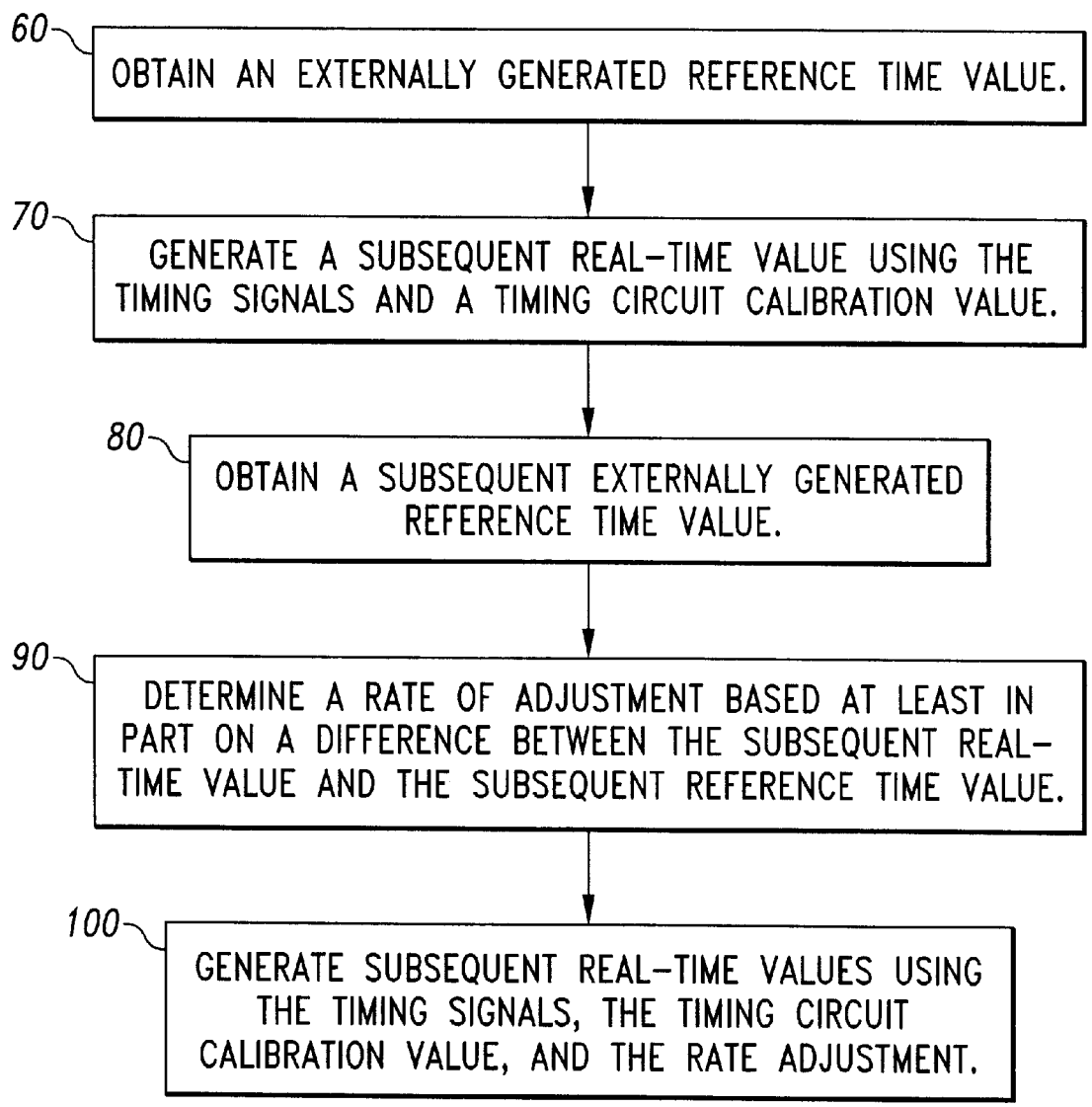
FIG. 2 shows a flow diagram of an exemplary method of adaptively calibrating a real-time clock within a utility meter according to the present invention.

FIG. 2 shows a flow diagram of an exemplary method of adaptively calibrating a real-time clock within a utility meter according to the present invention. As noted, the operations shown and described in connection with FIG. 2 are suitably carried out by the controller 18 of the exemplary utility meter 3 shown in FIG. 1.

In step 60, the controller 18 obtains an externally generated reference time value. The externally generated reference time value preferably represents a concurrent time value according to a suitable time standard. For example, the externally generated reference time value may be in terms of local time or Greenwich Mean Time. To this end, the controller 18 may suitably employ the communication circuit 6 (FIG. 1) to receive the externally generated reference time value from an external device (not shown). Communication of the externally generated first reference time value to the communication circuit 6 may suitably be initiated by the external device. Alternatively, such communication suitably may be responsive to a request from the controller 18 via the communication circuit 6 to the external device. The external device is, or is connected to, a device having a relatively accurate time clock. In any event, after step 60, the controller 18 proceeds to step 70.

In step 70, once the controller 18 obtains the externally generated time value, the controller 18 generates subsequent real-time values using timing signals from the timing circuit 5 and a timing circuit calibration value. In particular, as discussed above in connection with FIG. 1, the controller 18 maintains a real-time clock which generates real-time values. The real-time clock increments its real-time value based upon the timing signals received from the timing circuit 5. The timing circuit calibration value is the value that converts the timing signals into real-time increments.

For example, the timing signals may suitably be periodic voltage pulses having a period of 100 milliseconds, and the respective timing circuit calibration value suitably may be the number of pulses which are counted by a counter before the controller 18 increments the real-time clock by one second. In such a case, an appropriate timing circuit calibration is 10 pulses per second. Preferably, the initial timing circuit calibration value is suitably determined and set via well known factory calibration methods, which generally involve measuring the period of the timing signals on a test bench and setting the timing circuit calibration value accordingly. Additionally, as will be discussed in further detail below, the present invention employs a rate adjustment to compensate for inaccuracies in timekeeping that occur over time. Such inaccuracies may arise due to environment factors or other factors that negatively impact the operation of the crystal oscillator circuit of the timing circuit. In any event, once the controller 18 generates at least one subsequent real-time value in step 70, the controller 18 proceeds to step 80.

In step 80, the controller 18 obtains a subsequent externally-generated reference time value. In particular, from time to time, the controller 18 receives a real-time value from an external source for the purpose of adaptively calibrating its own real-time clock. Typically, step 80 occurs after the controller 18 has generated a substantial plurality of real-time values in step 70. For example, step 80 may occur more than one week or month from the execution of step 60.

To obtain the subsequent externally-generated reference value, the controller 18 receives the value via the communication circuit 6 (FIG. 1) from an external device (not shown). As with step 60, discussed above, the external device is a device having a relatively accurate time clock.

Communication of the subsequent externally-generated reference time value to the communication circuit 6 may suitably be initiated by the external device. However, it is noted that, alternatively, such communication may suitably be responsive to a communication to the external device by the controller 18 via the communication circuit 6. In any event, after step 80, the controller 18 proceeds to step 90.

In step 90, the controller 18 determines a rate adjustment based at least in part on a difference between the subsequent externally-generated reference time value obtained in step 80 and corresponding real-time value obtained in step 70. The corresponding real-time value is the most recent real-time value generated at the time the externally-generated reference time value is received in step 80. As discussed above in connection with FIG. 1, the rate adjustment suitably influences a rate at which the controller 18 increments the real-time clock. In general, the rate adjustment is used to compensate for inaccurate time keeping resulting from use of the timing signals and the timing circuit calibration value.

Specifically, while the use of the timing signals and the timing circuit calibration value may initially provide accurate time keeping, degradation of components over time can lead to time keeping inaccuracies, as discussed above. For example, the period of the timing signals produced in the field may deviate from the period measured on the factory calibration bench. The deviation may be due to any of a number of factors, such as, for example, actual field temperatures that differ from the those of the calibration environment.

In any event, the above method addresses the problem that the last determined timing circuit calibration value (whether via bench calibration or any other method) may no longer be appropriate for the current timing signals. For example, consider a situation in which the period of the timing signals was determined to be 100 milliseconds at the bench and the timing circuit calibration value was appropriately set to 10 pulses per second. In the field, however, suppose that the period doubles to 200 milliseconds due to component wear and/or temperature fluctuation. Without compensation, in this example the real-time clock would "run slow" or "lose time;" that is, the clock would only accrue 0.5 seconds for the passage of each 1 second according to a time standard.

To address such inaccuracies, the controller 18 in step 90 determines an error in the rate at which the real-time clock in the utility meter 3 (FIG. 1) accrues time. To this end, the controller 18 may determine the difference in the time accrued by its real-time clock and the time accrued by the external clock over a common interval. For example, the controller 18 may determine the difference in the amount of time accrued by its real-time clock and the external clock since the first externally generated reference time value was received in step 60. Accordingly, the rate adjustment may be based at least in part on this error. After step 90, the controller 18 proceeds to step 100.

In step 100, the controller 18 generates subsequent real-time values using the timing signals, the timing circuit calibration value, and the rate adjustment generated in step 90. As discussed above, the timing signals provide real-time intervals for the real-time clock, and the timing circuit calibration value and the rate adjustment influence the rate at which the real-time clock accrues time. To this end, as noted above in connection with FIG. 1, the controller 18 may apply the rate adjustment and the timing circuit calibration separately and distinctly, or, alternatively, the controller 18 may use the rate adjustment to determine a new timing circuit calibration value. Additionally, it is noted that although in the exemplary embodiment the operations shown and described in connection with FIG. 2 are suitably carried out by the controller 18 of the exemplary utility meter 3 shown in FIG. 1, they may alternatively be carried out by any suitable controller.

Figure 3:
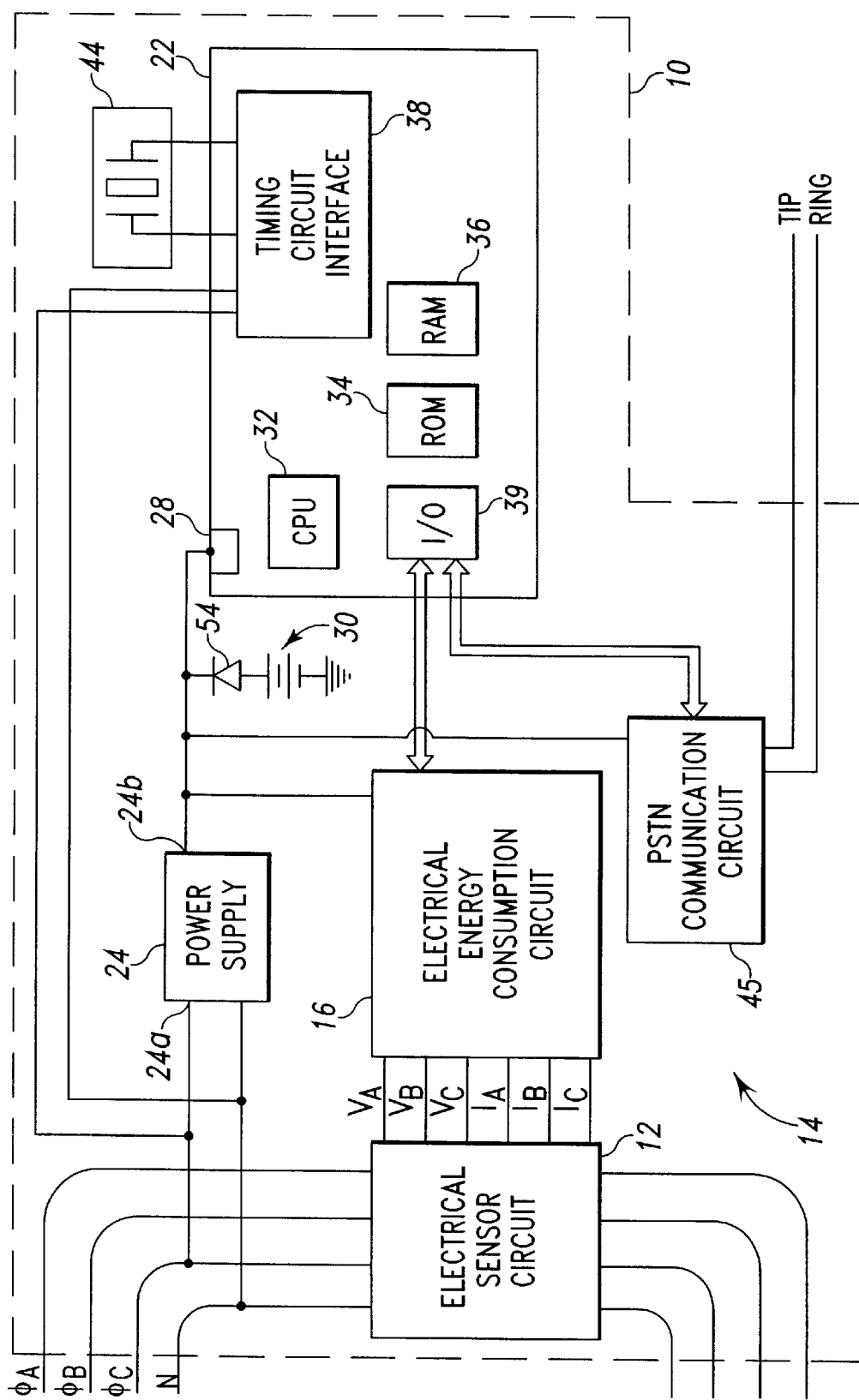
FIG. 3 shows a functional schematic diagram of an exemplary electronic electrical utility meter according to the present invention.

Next, FIG. 3 shows a functional schematic diagram of an exemplary electronic electrical utility meter 10 according to the present invention. In general, the electronic electrical utility meter 10 includes a sensor portion or electrical sensor circuit 12 and a measurement portion or measurement circuit 14. The electrical sensor circuit 12 is operably coupled to a plurality of utility power lines including a phase A power line $\phi A$, a phase B power line $\phi B$, a phase C power line $\phi C$, and a neutral line N. The plurality of utility power lines $\phi A$, $\phi B$, $\phi C$, and N connect to an electrical utility (not shown) and provide power from the utility to a load (not shown) for which power consumption is metered by the electronic electrical utility meter 10. The load may suitably be the electrical system of a residential facility, industrial facility, commercial facility, or the like.

It is noted that the exemplary embodiment described herein is installed in what is referred to as a three phase power configuration, consisting of three phases of power lines $\phi A$, $\phi B$, and $\phi C$. The present invention, however, is in no way limited to use in any particular power configuration, and those of ordinary skill in the art may readily modify the electronic electrical utility meter 10 for use in single phase and other power configurations.

Referring again to the exemplary embodiment shown in FIG. 3, the electrical sensor circuit 12 includes circuitry for generating signals indicative of the power provided to the load on the power lines $\phi A$, $\phi B$, $\phi C$, and N. To this end, the electrical sensor circuit 12 may include a plurality of current sensing devices, such as current transformers, current shunts, embedded coils or the like, which provide output measurement signals IA, IB, and IC that are representative of the current waveform on each of the lines $\phi A$, $\phi B$, and $\phi C$. Likewise, the electrical sensor circuit 12 may further include a plurality of voltage sensing devices, such as voltage divider circuits, which provide output measurement signals VA, VB, and VC that are representative of the voltage waveform on each of the lines $\phi A$, $\phi B$, and $\phi C$.

The measurement circuit 14, in general, is a circuit that is operable to: receive the signals representative of the power on the power lines $\phi A$, $\phi B$, and $\phi C$; receive externally generated reference time values; and generate metering information. The metering information is information which, among other things, tracks the amount of power or energy consumed by the load. In the exemplary embodiment described herein, the measurement circuit 14 includes an electrical energy consumption circuit 16, a controller 22, a crystal oscillator circuit 44, a PSTN communication circuit 45, a power supply 24, and a battery 30 with a diode 54.

The electrical energy consumption circuit 16 is a device that is operable to receive the analog measurement signals from the electrical sensor circuit 12 and provide raw electrical energy consumption information or data, and preferably other information or data therefrom. The phrases "electrical energy consumption information" and "electrical energy consumption data" are used interchangeably herein, and mean data that includes information regarding the energy flowing through the lines $\phi A$, $\phi B$, and $\phi C$, and may by way of example consist of digital words representative of values of watts, VA, VAR, watt-hrs, VA-hrs, VAR-hrs, power quality information or even constituent values such as Vrms, Irms or power factor information. Such electrical energy consumption circuits may be integrated into a single integrated circuit package. An example of such a circuit includes the Power Measurement Integrated Circuit found with the Model S-4 Meter available from Siemens Power Transmission & Distribution, Inc., in Lafayette Ind. Other examples of such circuits include the digital multiplication and DSP circuit 20 of U.S. Pat. No. 4,884,021 to Hammond, the digital signal processor 14 of U.S. Pat. No. 5,059,896, the front end CPU 44 of U.S. Pat. No. 5,471,137 to Briese et al., and the A/D and DSP 14 of U.S. Pat. No. 5,544,089 to Hemminger et al., all of which are incorporated herein by reference.

Referring again to the exemplary embodiment shown in FIG. 3, the controller 22 is a microcontroller that includes a central processing unit ("CPU") 32, a read only memory ("ROM") 34, a random access memory ("RAM") 36, an input/output ("I/O") device 39, a timing circuit interface 38, and a bias connection 28. The controller 22 is configured in a manner well known in the art to obtain electrical energy consumption data and timing signals and generate metering information therefrom. To this end, the CPU 32, which preferably executes a program stored in the ROM 34, is operable to control the operation of the various devices of the controller 22. In particular, the CPU 32 receives electrical energy consumption data from the electrical energy consumption circuit 16 through the I/O device 39 and receives timing signals from the crystal oscillator circuit 44 through the timing circuit interface 38. The timing signals are preferably periodic pulses generated by the crystal oscillator circuit 44. Additional detail regarding the timing signals is provided further below.

The timing circuit interface 38 converts the timing signals into digital information that the controller 22 may use to maintain its real-time clock. Preferably, the timing circuit interface 38 includes a counter that converts the timing signals into a count value representing the number of timing pulses received since the counter has been reset. Further, the timing circuit interface 38 preferably includes an arrangement for generating an interrupt signal when the counter reaches a particular end value, where that end value may be set by the CPU 32, and whereby the CPU 32 may cause the controller 22 to perform particular operations in response to the interrupt. As discussed below in connection with FIG. 4, such a configuration facilitates application of a timing circuit calibration value, CALV, as the end value for a counter, COUNT, which may suitably be within the timing circuit interface 38. In any event, suitable ways of making and using the timing circuit interface 38 are well known.

The CPU 32 is also operably connected to obtain externally generated reference time values from the PSTN communication circuit 45 through the I/O 39. The CPU 32 is also operably configured to use the RAM 36 and/or registers internal and external to the CPU 32 to store various values, including interim calculations, in order to carry out processes that generate the metering information and operate the real-time clock. The metering information may include, by way of example, accumulated electrical energy consumption information as well as real-time correlated quantities associated with demand metering and time of use metering.

The crystal oscillator circuit 44 is operable to generate the timing signals used by the CPU 32 to maintain the real-time clock. The crystal oscillator circuit 44 is operable to generate the timing signal in the form of voltage pulses, which are separated by fairly precise real-time periods. In the exemplary embodiment described herein, the crystal oscillator circuit 44 provides the voltage pulses at a frequency of about 32.768 kHz, which is a commonly used frequency for such timing applications. To this end, the crystal oscillator circuit 44 may suitably include a product number CM200532.768 KDZF crystal oscillator, which is manufactured by Citizen. In any event, it is noted that crystal oscillator circuit 44 is merely an exemplary embodiment of the timing circuit 5 of FIG. 1, and, consequently, crystal oscillator circuit 44 may be replaced with any suitable alternative (which may or may not include a crystal oscillator) as discussed in connection with the timing circuit 5 of FIG. 1.

The bias connection 28 is a pin connection to the controller 22 that is coupled to the power supply 24. The bias connection 28 is operably coupled to provide the bias power generated by the power supply 24 to various devices within the controller 22 as necessary, such as, for example, the CPU 32, the RAM 36, and the timing circuit interface 38. Examples of controllers and processors that may be configured to operate as the controller 18 described herein are described in U.S. Pat. Nos. 4,884,021, 5,059,896, 5,471,137 and 5,544,089, discussed above.

The PSTN communication circuit 45 is operable to receive externally generated reference time values from an external device, such as, for example, a remote computer (not shown). Additionally, the PSTN communication circuit 45 is preferably operable to effectuate other communications with one or more external devices such as, for example, transmitting metering and/or diagnostic information generated by the electronic electrical utility meter 10 to an external device. In the exemplary embodiment described herein, the PSTN communication circuit 45 is operable to communicate over the TIP and RING lines of a public switched telephone network ("PSTN"), and is operably coupled to the power supply 24 to receive bias power therefrom. To this end, in a manner which is well known, the PSTN communication circuit 45 is suitably comprised of a data access arrangement circuit ("DAA") (not shown) and a high speed digital modem (not shown). The DAA is a device that effectively converts signals between the signal format of the PSTN and the signal format of the modem. In addition, the DAA preferably includes a telephone circuit that performs ring detection, isolation, hook switch, and other telephony functions. The modem effectuates communications of digital information from and/or to the remote device. The DAA and the modem include data ports through which they interface with the controller 22 through the I/O 39. Suitable DAA and modem circuitry is well known and widely available.

In any event, it is noted that the PSTN communication circuit 45 described herein is merely exemplary, and the PSTN communication circuit 45 may be implemented in any of various alternative manners which are well known. Moreover, it is noted that the PSTN communication circuit 45 is merely an exemplary embodiment of the communication circuit 6 of FIG. 1, and, consequently, the PSTN communication circuit 45 may be replaced with any suitable alternative as discussed in connection with the communication circuit 6 of FIG. 1.

The power supply 24 is a circuit that is operable to convert AC electrical power received from an external power source, which in the exemplary embodiment is the phase C power line φC, to a bias voltage, preferably a DC bias voltage. The power supply 24 is constructed in a manner which is well known and, for example, the power supply 24 may suitably be a switched-mode inverter type power supply that converts the power line AC voltage received at its input 24a to one or more DC bias voltages provided at its output 24b. The power supply input 24a is operably coupled across the phase C power line φC and the neutral line N, and the power supply output 24b is operably coupled to the electrical energy consumption circuit 16, the PSTN communication circuit 45, and the bias connection 28 of the controller 22. It will be noted that in the alternative, the power supply 24 may suitably be connected to receive electrical power from other power lines, all of the power lines or alternative power sources. In any event, various ways of making and using suitable power supplies are well known.

The battery 30 and the diode 54 are operable to provide an alternate bias voltage in lieu of sufficient bias voltage from the power supply 24. It is well known for metering devices to include battery power sources. In any event, the battery 30 is operably coupled to the diode 54, and the diode 54 is operably coupled to the electrical energy consumption circuit 16, the PSTN communication circuit 45, the bias connection 28 of the controller 22, and the power supply output 24b.

In operation of the exemplary electronic electrical utility meter 10 shown in FIG. 3, the load (not shown) obtains AC electrical power from the electrical utility (not shown) through the power lines φA, φB, φC, and N. Typically, in any of various manners which are well known, the load does some type of work for the customer. In any event, the crystal oscillator circuit 44 obtains AC electrical power from the power line φC. The crystal oscillator circuit 44 uses this power to generate timing signals in the form of a sinusoidal voltage. As discussed above, the crystal oscillator circuit 44 provides the timing signals to the controller 22 through the timing circuit interface 38.

Meanwhile, the electrical sensor circuit 12 detects the power provided to the load and generates measurement signals representative of the power flow. The electrical sensor circuit 12 provides the measurement signals to the electrical energy consumption circuit 16. In particular, the electrical sensor circuit 12 generates the three voltage measurement signals VA, VB, and VC and the three current measurement signals IA, IB, and IC. Each of the three voltage measurement signals is an analog signal that is representative of the voltage waveform on one of the power lines, and each of the three current measurement signals is an analog signal that is representative of the current waveform on one of the power lines. The electrical energy consumption circuit 16 then generates electrical energy consumption data or information based on the measurement signals. For example, the electrical energy consumption circuit 16 may generate digital signals that include electrical energy consumption information relating to watts, VAs, VARs, watt-hrs, VA-hrs, VAR-hr, or component signals thereof. In a manner which is well known, the electrical energy consumption circuit 16 provides the electrical energy consumption information to the controller 22 through the I/O device 39.

The controller 22 uses the electrical energy consumption information to generate metering information and uses the timing signals to maintain an internal real-time clock. The controller 22 also uses the real-time clock and the electrical energy consumption information to generate real-time correlated metering information. Well-known examples of real-time correlated metering information include demand metering information and time of use metering information. Power quality meters, such as that disclosed in U.S. Pat. No. 5,627,759, also generate real-time correlated metering information. For example, a power quality meter may use real-time stamps in recording power surge or power sag events.

Figure 4:
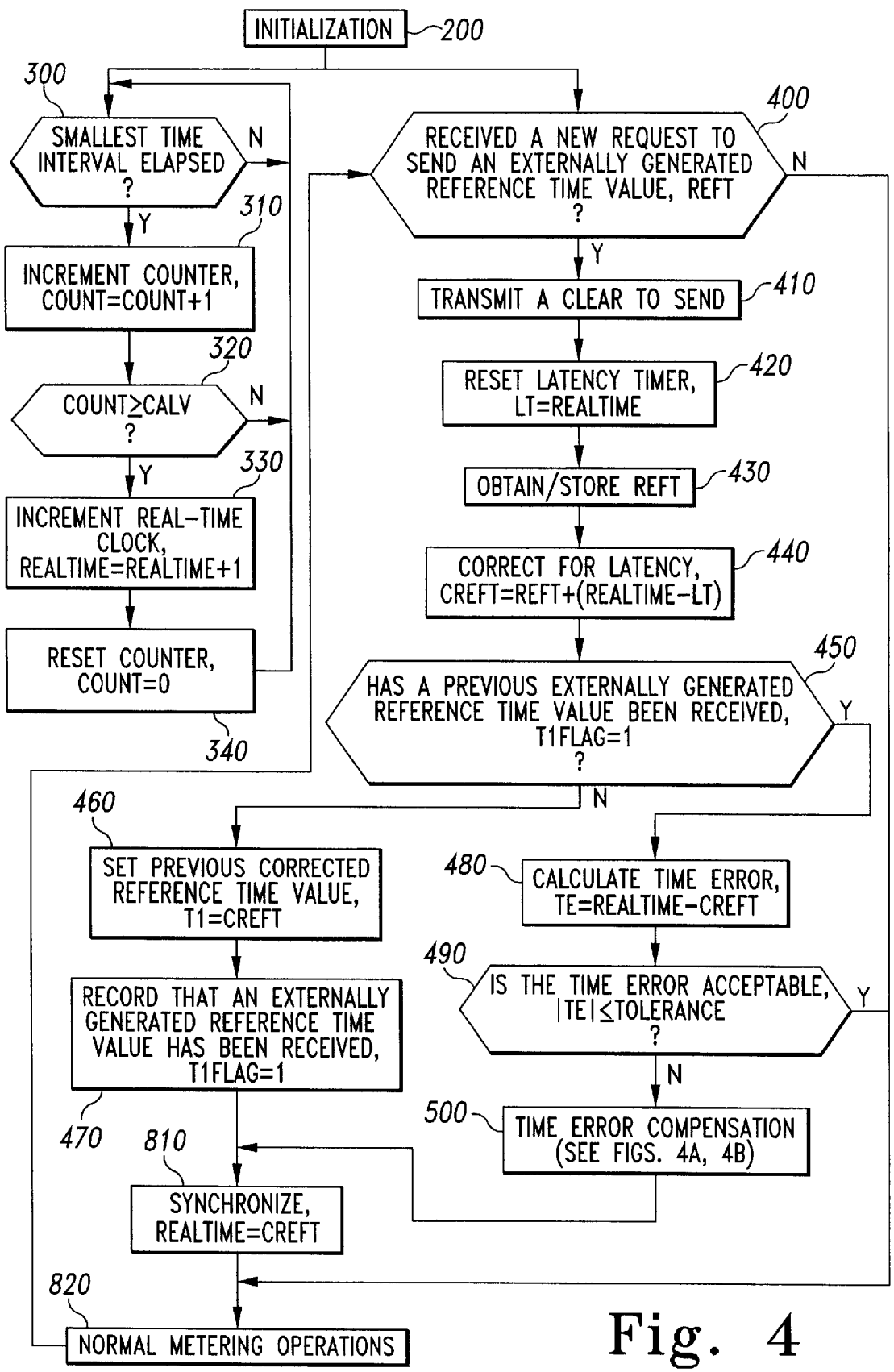
FIGS. 4, 4A, and 4B show a flow diagram of exemplary operations for the controller 22 of the exemplary electronic electrical utility meter shown in FIG. 3.
Figure 4A:
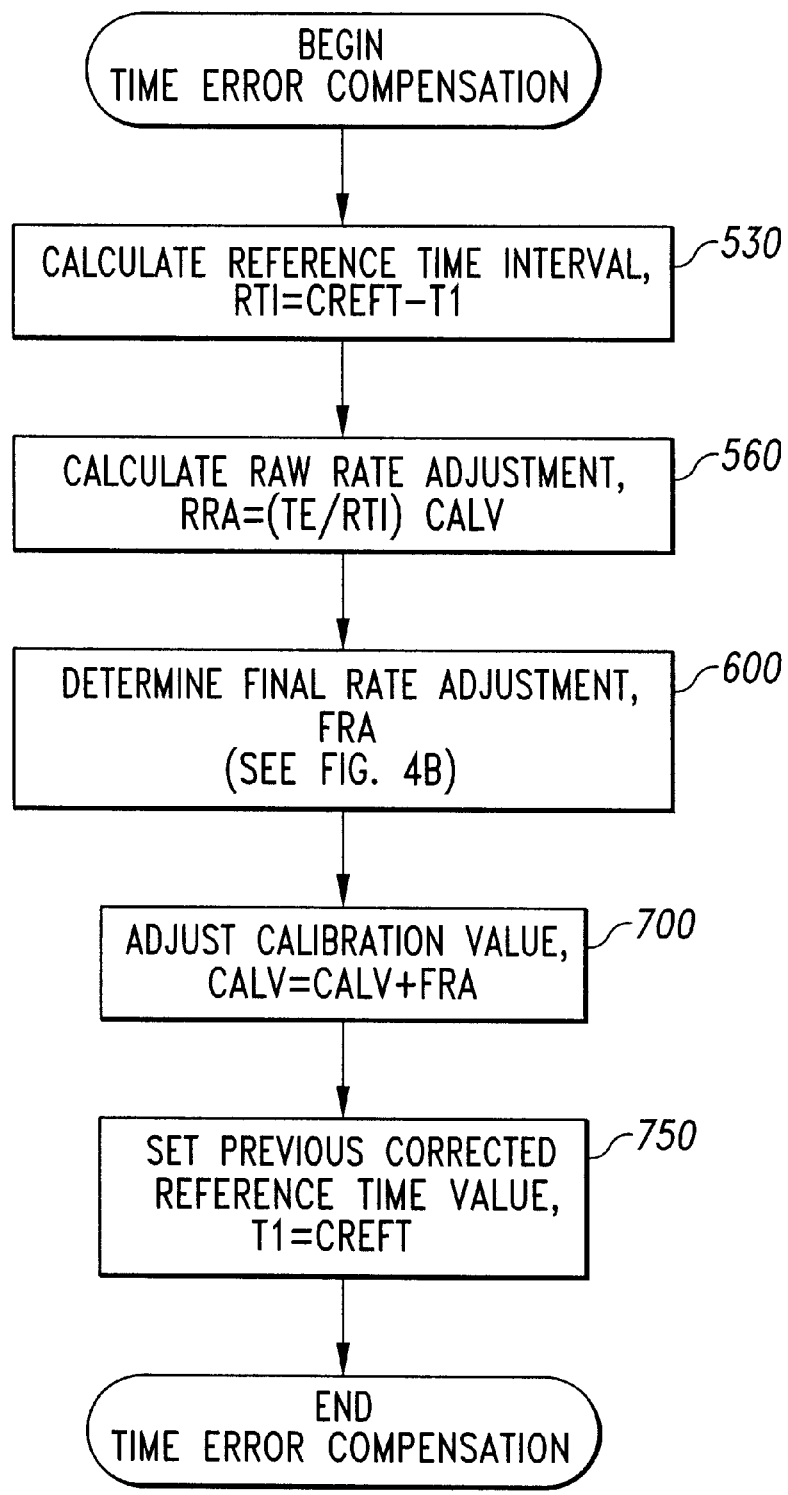
Figure 4B:
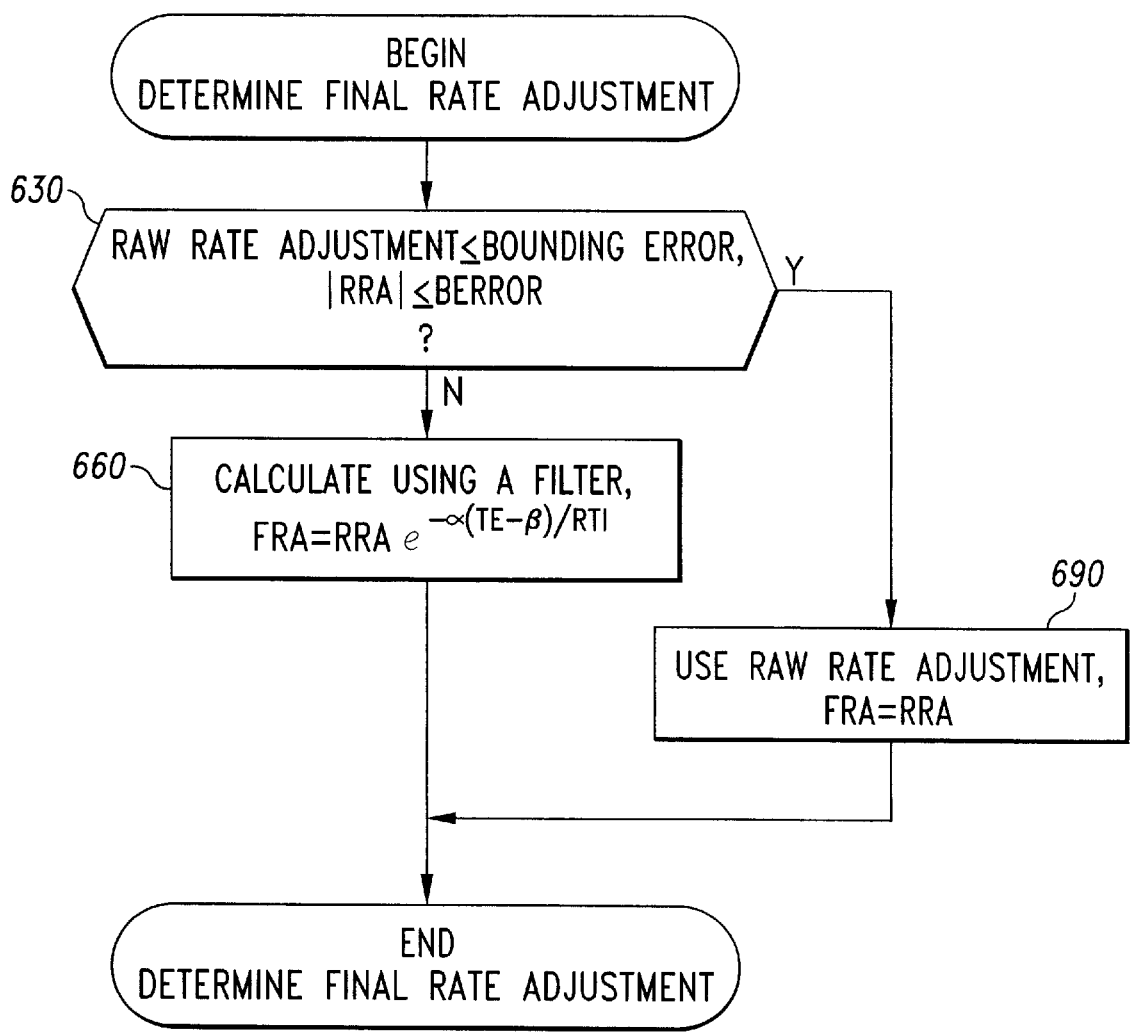

In accordance with the present invention, the controller further adaptively calibrates its internal real-time clock using externally generated reference time values which may be received, from time to time, from an external clock via the PSTN communication circuit 45. FIGS. 4, 4A, and 4B discussed below show the operations of the controller 22 in maintaining and adaptively calibrating its real-time clock. For context, FIG. 4 also includes a block that generally represents normal metering operations, which may suitably include the generation of metering information and/or real-time correlated metering information.

More particularly FIGS. 4, 4A, and 4B show a flow diagram of exemplary operations for the controller 22 of the exemplary electronic electrical utility meter 10 shown in FIG. 3. However, it is noted that although the operations shown in FIGS. 4, 4A, and 4B and described below are suitably carried out by the controller 22, they may, nevertheless, be carried out by any suitable controller. Furthermore, the flow diagram includes the normal operations of the controller 22 as well as operations relating specifically to adaptively calibrating the time keeping circuitry of the electronic electrical utility meter 10. Normal metering operations, such as those that relate to generating metering information, are highly generalized and are only illustrated to place the operations relating to the adaptive calibration in context.

Referring to FIG. 4, step 200 illustrates the first step, which the controller 22 executes upon initial power up of the electronic electrical utility meter 10. The initial power up may occur, for example, when the battery 30 is installed or when the electronic electrical utility meter 10 is first connected to the power lines φA, φB, φC, and N. In any event, in step 200 the controller 22 initializes program parameters and performs other start-up operations.

Next, in general, steps 300 through 340 illustrate maintenance of a real-time clock by the controller 22, while steps 400 through 810 generally illustrate other normal metering operations and operations relating to adaptively calibrating the real-time clock. Preferably, the controller 22 performs the operations illustrated by steps 300 through 340 fairly concurrently with the operations illustrated by steps 400 through 810. Such concurrent operating modes are well known. For example, the controller 22 may suitably execute multi-tasking real-time operating system software in which the maintenance of the real-time clock is coded as one task and the adaptive calibration and the other operations are coded as one or more other tasks. It is noted, however, that concurrent performance of these two sets of steps, while preferred, is not required. For example, the operations illustrated by steps 300 through 340 and by steps 400 through 810 may be performed purely sequentially in relation to each other.

In any event, in step 300 the controller 22 (and, more particularly the timing circuit interface 38) determines whether the smallest real-time interval provided by the timing signals has elapsed. As discussed above in connection with FIG. 3, the crystal oscillator circuit 44 provides the timing signals in the form of a periodic voltage. Accordingly, in the exemplary embodiment, the smallest real-time interval is one cycle (or one period) of the oscillator voltage pulses. The timing circuit interface 38 remains at step 300 until it determines that a cycle of the voltage pulses has elapsed. Upon elapse of the cycle, the timing circuit interface 38 proceeds to step 310, where it increments a counter value, COUNT. After step 310, the timing circuit interface 38 proceeds to step 320.

In step 320, the controller 22 (via the timing circuit interface 38) determines whether COUNT is equal to or greater than CALV. More particularly, in the embodiment herein, the timing circuit interface 38 generates an interrupt which causes the CPU to execute step 330 (where it increments the real-time clock value, REALTIME) if COUNT is equal to or greater than CALV. Otherwise, the timing circuit interface 38 returns to step 300 to count the next timing signal pulse.

In any event, it can be seen in steps 320 and 330 that the timing circuit calibration value influences the rate at which the real-time clock accrues time. More particularly, a higher CALV results in a higher COUNT before REALTIME is incremented, and the higher COUNT requires the elapse of a greater number of voltage pulses, which requires the elapse of a larger amount of real-time (and vice-versa). For example, for a given timing signal frequency, doubling CALV halves the rate at which the controller 22 increments REALTIME, and, conversely, halving CALV doubles the rate at which the controller 22 increments REALTIME. Accordingly, as will be discussed below in connection with steps 400 through 800, the present invention increases or decreases CALV as necessary to effectuate an adaptive calibration. After step 330, the controller 22 resets COUNT to zero and loops back to step 300, where it repeats steps 300 through 340 as discussed above.

Meanwhile, in step 400 the controller 22 determines whether the PSTN communication circuit 45 (FIG. 3) has received, from an external device (not shown), a communication indicating a new request to send an externally generated reference time value, REFT, to the electronic electrical utility meter 10 (FIG. 3). In the exemplary embodiment, the request to send initiates procedures related to the adaptive calibration of the real-time clock, REALTIME, the general maintenance of which is discussed above. Accordingly, if the request to send has been received, then the controller 22 proceeds to step 410 in furtherance of the adaptive calibration; else, the controller 22 jumps to step 810 ("normal metering operations," discussed below).

In step 410, the controller 22 uses the PSTN communication circuit 45 to transmit a clear to send message to the external device. The clear to send message informs the external device that the electronic electrical utility meter 10 is ready to receive the externally generated reference time value. After step 410, the controller 22 proceeds to step 420.

In step 420, the controller 22 resets a latency timer, LT, with the current real-time value from the real-time clock, REALTIME. In step 440 below, LT is used to correct the externally generated reference time value for the transmission time required for it to reach the electronic electrical utility meter 10. After step 420, the controller 22 proceeds to step 430.

In step 430, the controller 22 obtains the externally generated reference time value from the PSTN communication circuit 45 and saves it in REFT. After step 430, the controller 22 proceeds to step 440, where it corrects the externally generated reference time value for the transmission time that was required for it to reach the electronic electrical utility meter 10. The controller 22 makes the correction by adding to REFT the difference between the new current real-time value of the real-time clock, REALTIME, and the previous value, LT (which was stored in the latency timer in step 420). The controller 22 saves the result as the corrected reference time value, CREFT. It is noted, however, that the latency time correction approach described herein is merely exemplary and other suitable ways of correcting the externally generated reference time for the transmission time required for communications between the external device and the electronic electrical utility meter 10 may be readily devised by one of ordinary skill in the art.

For example, in alternative embodiments, the external device may suitably add an anticipated transmission delay time into the externally generated reference time value before transmitting it, thereby alleviating the need for latency correction by the controller 22. Moreover, the latency time correction is not essential to the efficacy of present invention. For example, one of ordinary skill in the art will readily appreciate that the latency correction may be dispensed with altogether when the transmission time is sufficiently less than the acceptable time error between the REALTIME and the externally generated reference time value. In any event, after step 440, the controller 22 proceeds to step 450.

In step 450, the controller 22 determines whether a previous externally generated reference time value has been received by checking the status of a flag, T1 FLAG. The time error compensation computations of the present invention require at least two reference time values. So, if a previous externally generated reference time value has been received; i.e., if T1FLAG equals one, then the controller 22 jumps to step 480, where it continues with the adaptive calibration as discussed below. However, if a previous externally generated reference time value has not been received; i.e. the first time the real-time clock is synchronized or set upon power up of the electronic electrical utility meter 10, then the controller 22 proceeds to step 460, where it sets the previous corrected reference time value, T1, equal to the corrected reference time value, CREFT, and then proceeds to step 470, where makes a record that an externally generated reference time value has been received by setting the appropriate flag; i.e., by setting T1FLAG equal to one. After step 470, the controller 22 proceeds to step 800, which is discussed below.

As discussed above, the controller 22 arrives at step 480 only when it is determined that a previous externally generated reference time value had been received. In step 480, the controller 22 calculates a time error, TE. TE is the difference between the current real-time value in the real-time clock, REALTIME, and the corrected reference time value, CREFT. As discussed above, the externally generated reference time value from which CREFT is derived preferably correlates with a time standard. Thus, in such a case, TE indicates the accuracy (or inaccuracy) of the time keeping circuitry of the electronic electrical utility meter 10. In other words, the closer that TE is to zero, the more accurate the real-time clock, REALTIME. After step 480, the controller 22 proceeds to step 490.

In step 490, the controller 22 determines whether the time error, TE, is within acceptable limits. Ideally, of course, the real-time value in the real-time clock would correlate exactly with the corrected reference time, and hence, further adaptive calibration steps would be unnecessary. In such a case, REALTIME would equal CREFT and, consequently, TE would be zero. However, as discussed above, various environmental effects and aging of the time keeping circuitry of the electronic electrical utility meter 10 may result in a TE other than zero. Moreover, computational rounding errors within the controller 22 may result in the calculation of a nonzero TE even when the real-time value in the real-time clock actually correlates exactly with the external standard. So, in step 490, the controller 22 applies a tolerance, TOLERANCE. If the controller 22 determines that the absolute value of TE is equal to or less than TOLERANCE, then the controller 22 jumps past the remaining time error compensation steps to step 820 ("normal metering operations," discussed below); else, the controller 22 proceeds to step 500, where it performs the time error compensation steps shown in FIGS. 4A ad 4B.

Referring now to FIG. 4A, in step 530 the controller 22 calculates a reference time interval, RTI. RTI is the difference between the corrected reference time value, CREFT, and the previous corrected reference time value, T1. After step 530, the controller 22 proceeds to step 560, where it uses RTI in calculating a raw (unfiltered) rate adjustment, RRA.

In step 560, the controller 22 calculates the raw rate adjustment, RRA, by dividing the time error, TE, by the reference time interval, RTI, and by multiplying the result by the calibration value, CALV. Roughly, RRA represents the number that should be added or subtracted (depending on whether it is positive or negative, respectively) to the calibration value, CALV (see steps 300 through 340, discussed above), in order to decrease or increase, respectively, the rate at which the real-time clock, REALTIME, accrues time so that the rate of REALTIME more closely corresponds to that of the external standard. After step 560, the controller 22 proceeds to step 600, where it performs the final rate adjustment steps shown in FIG. 4B.

Referring now to FIG. 4B, in step 630 the controller 22 determines whether the raw rate adjustment, RRA, is equal to or less than the bounding error of a suitable digital filter which the controller applies in step 660. As is well known, a digital filter is typically not effective for an error less than its bounding error. Accordingly, if the absolute value of RRA is equal to or less than the bounding error, then the controller 22 bypasses the filter by jumping to step 690, where it sets a final rate adjustment, FRA, equal to the raw rate adjustment, RRA, and then proceeds to step 700 (FIG. 4A); else, the controller 22 proceeds to step 660.

In step 660, the controller 22 calculates the final rate adjustment, FRA, using a filter which, in the exemplary embodiment described herein, uses any of various well known digital filtering techniques to approximate the following mathematical formula:

$$FRA = RRA e^{-\alpha(TE-\beta)/RTI}$$

Where, as is well known, $\alpha$ is a suitable programmable damping coefficient and $\beta$ is a suitable error bounding coefficient. As discussed above, RRA is the raw rate adjustment; TE is the time error, and RTI is the reference time interval.

The filtering reduces the sensitivity of the adaptive calibration to occasional errors in the externally generated reference time values which may arise from component failures in the external device or other reasons. As a result, such errors may be remedied between adaptive calibrations with reduced impacts on the accuracy of REALTIME. To this end, the controller 22 may employ any suitable alternative filter design or approximation algorithm. Furthermore, as is well known, a suitable alternative filter may be implemented using analog hardware that is separate from or integral to the controller 22. Moreover, in some embodiments, the filter may suitably be omitted. In any event, after step 660, the controller 22 proceeds to step 700 (FIG. 4A).

Referring again to FIG. 4A, in step 700 the controller 22 adjusts the timing circuit calibration value, CALV, by adding to CALV the final rate adjustment, FRA and saving the result back into CALV. As discussed above, CALV adjusts the rate at which the real-time clock, REALTIME, accrues time. After step 700, the controller 22 proceeds to step 750.

In step 750, the controller 22 sets the previous corrected reference time value, T1, equal to the corrected reference time value, CREFT. By saving CREFT in T1, the controller 22 prepares for the next (subsequent) adaptive calibration, wherein it will use T1 in conjunction with a new corrected reference time value. After step 750, the controller 22 proceeds to step 800 (FIG. 4).

Referring again to FIG. 4, in step 810 the controller 22 synchronizes the real-time clock, REALTIME, with the corrected reference time, CREFT. It will be appreciated that the synchronization is in addition to the rate adjustment made by the previous steps. Synchronizing REALTIME to CREFT provides immediate accuracy to the real-time value in REALTIME. After step 810, the controller 22 proceeds to step 820.

Step 820 illustrates the "normal metering operations" of the controller 22 when AC electrical power is present. In step 820, the controller 22 receives the electrical energy consumption data through the I/O device 39 and generates metering information. To this end, the controller 22 may convert the raw electrical energy consumption data received from the electrical energy consumption circuit 16 to standardized units for storage and display. Such operations are well known. The controller 22 may in any event generate metering information including, but not limited to, watt-hrs, VA-hrs, VAR-hrs, RMS voltage and current information. Furthermore, the metering information may include time correlated information in any of various formats such as demand metering or time-of-use metering. In a manner or manners which are well known, the controller 22 uses real-time values from its real-time clock, REALTIME, to time correlate the information. The general maintenance of REALTIME is discussed above. It will be noted that the controller 22 may suitably perform several other functions during "normal metering operations" which are not central to the operation of the present invention, and therefore are omitted for clarity of exposition. After step 820, the controller 22 loops back to step 400, where it repeats steps 400 through 820 as discussed above.

Therefore, there are a plurality of advantages of the present invention arising from automatically adaptively calibrating the real-time time keeping circuitry in the utility meter responsive to observed errors in the real-time kept in the meter during operation. It is noted, however, that the embodiments described herein are merely exemplary, and that those of ordinary skill in the art may readily devise their own implementations that incorporate the principals of the present invention and fall within the spirit and scope thereof. Furthermore, it is noted that alternative embodiments of the present invention may not include all of the features described herein yet still benefit from at least some of the advantages of the invention. Those of ordinary skill in the art may readily devise their own such implementations that incorporate one or more of the features of the present invention and fall within the spirit and scope thereof.

It is further noted that the present invention is not limited to electrical utility meters, and thus, the present invention may readily be incorporated into other types of electronic utility meters, including gas meters, water meters, or other utility meters. Such utility meters would typically include a source of commodity consumption data or information, a timing circuit for generating timing signals, and a controller for generating metering information. For example, an electronic gas meter may include a source of gas consumption information, a timing circuit, and a controller for generating metering information based on the gas consumption information and the timing signals.

What is claimed is:

1. A utility meter, comprising:
   a) a source of commodity consumption information;
   b) a timing circuit operable to generate timing signals;
   c) a communication circuit operable to receive externally generated reference time values; and
   d) a controller operably coupled to said source of commodity consumption information to receive commodity consumption information therefrom, operably coupled to said timing circuit to receive timing signals therefrom, and operably coupled to said communication circuit to obtain the externally generated reference time values therefrom, the controller operable to:
      generate metering information based at least in part on said commodity consumption information;
      generate a first real-time value based at least in part on an externally generated first reference time value;
      derive a subsequent second real-time value, based at least in part on the first real-time value, the timing signals, and a calibration value;
      obtain an externally generated second reference time value;
      determine a rate adjustment based at least in part on a difference between said second real-time value and said second reference time value; and
      generate a subsequent real-time value based at least in part on said timing signals, the calibration value, and the rate adjustment.

2. The utility meter of claim 1, wherein said source of commodity consumption information includes at least one source of electrical energy consumption information.

3. The utility meter of claim 2, wherein said timing circuit includes at least one crystal oscillator circuit.

4. The utility meter of claim 2, wherein said controller is further operable to correlate said metering information to at least one of said real-time values.

5. The utility meter of claim 2, wherein said controller is further operable to:
   generate an adjusted real-time value based at least in part on a synchronization to said second reference time value; and
   generate said subsequent real-time value further based at least in part on said adjusted real-time value.

6. The utility meter of claim 5, wherein said controller is further operable to:
   obtain a first difference between the second real-time value and the second reference time value;
   obtain a second difference between the first reference time value and the second reference time value;
   determine the rate adjustment based at least in part on the first difference and the second difference.

7. The utility meter of claim 5, wherein said controller is further operable to determine the rate adjustment based at least in part on a tolerance around said difference between said second real-time value and said second reference time value.

8. The utility meter of claim 2, further comprising a communication circuit operably coupled to said controller to effectuate communications with an external device.

9. The utility meter of claim 2, wherein the controller is further operable to generate the subsequent real-time value based at least in part on said timing signals, the calibration value, and the rate adjustment by:
   generating an adjusted calibration value based at least in part on the rate adjustment; and
   generating the subsequent real-time value based at least in part on said timing signals and said adjusted calibration value.

10. An arrangement for adaptive time keeping in a utility meter, the arrangement comprising:
    a) a timing circuit operable to generate timing signals;
    b) a controller operably coupled to said timing circuit to receive timing signals therefrom, the controller operable to:
       generate a first real-time value based at least in part on an externally generated first reference time value;
       derive a subsequent second real-time value, based at least in part on the first real-time value, the timing signals, and a calibration value;
       obtain an externally generated second reference time value;
       determine a rate adjustment based at least in part on a difference between said second real-time value and said second reference time value; and
       generate a subsequent real-time value based at least in part on said timing signals, the calibration value, and the rate adjustment.

11. The arrangement of claim 10, wherein said timing circuit includes at least one crystal oscillator circuit.

12. The arrangement of claim 10, wherein said controller is further operable to:
    generate an adjusted real-time value based at least in part on a synchronization to said second reference time value; and
    generate said subsequent real-time value further based at least in part on said adjusted real-time value.

13. The arrangement of claim 12, wherein said controller is further operable to:
    obtain a first difference between the second real-time value and the second reference time value;
    obtain a second difference between the first reference time value and the second reference time value;
    determine the rate adjustment based at least in part on the first difference and the second difference.

14. The arrangement of claim 12, wherein said controller is further operable to determine the rate adjustment based at least in part on a tolerance around said difference between said second real-time value and said second reference time value.

15. The arrangement of claim 10, further comprising a communication circuit operably coupled to said controller to effectuate communications with an external device.

16. The arrangement of claim 10, wherein the controller is further operable to generate the subsequent real-time value based at least in part on said timing signals, the calibration value, and the rate adjustment by:
    generating an adjusted calibration value based at least in part on the rate adjustment; and
    generating the subsequent real-time value based at least in part on said timing signals and said adjusted calibration value.

17. A method of adaptively calibrating a real-time clock within a utility meter, the real-time clock generating real-time values based at least in part on timing signals generated by a timing circuit, the method comprising:
    a) generating a first real-time value based at least in part on an externally generated first reference time value;
    b) deriving a subsequent second real-time value based at least in part on the first real-time value, the timing signals, and a calibration value;

c) obtaining an externally generated second reference time value;

d) determining a rate adjustment based at least in part on a difference between said second real-time value and said second reference time value; and e) generating a subsequent real-time value based at least in part on said timing signals, the calibration value, and the rate adjustment.

18. The method of claim 17, wherein:

step b) includes obtaining the timing signals from at least one crystal oscillator circuit.

19. The method of claim 17, wherein:

step e) includes obtaining the timing signals from at least one crystal oscillator circuit.

20. The method of claim 17, further comprising the steps of:

f) generating an adjusted real-time value based at least in part on a synchronization to said second reference time value; and g) generating said subsequent real-time value further based at least in part on said adjusted real-time value.

21. The method of claim 20, wherein step d) includes:

obtaining a first difference between the second real-time value and the second reference-time value;

obtaining a second difference between the first reference time value and the second reference time value;

determining the rate adjustment based at least in part on the first difference and the second difference.

22. The method of claim 20, wherein step d) further includes determining the rate adjustment based at least in part on a tolerance around said difference between said second real-time value and said second reference time value.

23. The method of claim 17, wherein step c) includes effectuating communications with an external device via a communication circuit.

24. The method of claim 17, wherein step e) includes:

generating an adjusted calibration value based at least in part on the rate adjustment; and generating the subsequent real-time value based at least in part on said timing signals and said adjusted calibration value.

25. A method of generating metering information within a utility meter, the utility meter having a source of commodity consumption information and the utility meter having a real-time clock generating real-time values based at least in part on timing signals generated by a timing circuit, the method comprising:

a) generating a first real-time value based at least in part on an externally generated first reference time value;

b) deriving a subsequent second real-time value based at least in part on the first real-time value, the timing signals, and a calibration value;

c) obtaining an externally generated second reference time value;

d) determining a rate adjustment based at least in part on a difference between said second real-time value and said second reference time value;

e) generating a subsequent real-time value based at least in part on said timing signals, the calibration value, and the rate adjustment; and f) generating the metering information based at least in part on the commodity consumption information and said subsequent real-time value.

26. The method of claim 25, wherein said source of commodity consumption information includes at least one source of electrical energy consumption information.

27. The method of claim 26, wherein:

step b) includes obtaining the timing signals from at least one crystal oscillator circuit.

28. The method of claim 26, wherein:

step e) includes obtaining the timing signals from at least one crystal oscillator circuit.

29. The method of claim 26, further comprising the steps of:

g) generating an adjusted real-time value based at least in part on a synchronization to said second reference time value; and h) generating said subsequent real-time value further based at least in part on said adjusted real-time value.

30. The method of claim 29, wherein step d) includes:

obtaining a first difference between the second real-time value and the second reference time value;

obtaining a second difference between the first reference time value and the second reference time value;

determining the rate adjustment based at least in part on the first difference and the second difference.

31. The method of claim 29, wherein step d) further includes determining the rate adjustment based at least in part on a tolerance around said difference between said second real-time value and said second reference time value.

32. The method of claim 26, wherein step c) includes effectuating communications with an external device via a communication circuit.

33. The method of claim 26, wherein step e) includes:

generating an adjusted calibration value based at least in part on the rate adjustment; and generating the subsequent real-time value based at least in part on said timing signals and said adjusted calibration value.

* * * * *